(12) United States Patent
Torii

(10) Patent No.: US 11,209,731 B2
(45) Date of Patent: Dec. 28, 2021

(54) IMPRINT DEVICE AND METHOD FOR MANUFACTURING ARTICLE

(71) Applicant: CANON KABUSHIKI KAISHA, Tokyo (JP)

(72) Inventor: Hirotoshi Torii, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 184 days.

(21) Appl. No.: 16/411,293

(22) Filed: May 14, 2019

(65) Prior Publication Data

US 2019/0354009 A1    Nov. 21, 2019

(30) Foreign Application Priority Data

May 18, 2018 (JP) .............................. JP2018-096535

(51) Int. Cl.
| | |
|---|---|
| *G03F 7/00* | (2006.01) |
| *H01L 21/027* | (2006.01) |
| *B29C 59/00* | (2006.01) |
| B29C 59/02 | (2006.01) |
| G03F 7/20 | (2006.01) |

(52) U.S. Cl.
CPC ............ *G03F 7/0002* (2013.01); *B29C 59/00* (2013.01); *H01L 21/0271* (2013.01); *B29C 59/02* (2013.01); *B29C 59/022* (2013.01); *B29C 59/026* (2013.01); *B29C 2059/023* (2013.01); *G03F 7/70483* (2013.01); *G03F 7/70491* (2013.01); *G03F 7/70766* (2013.01); *G03F 7/70775* (2013.01)

(58) Field of Classification Search
CPC ....... B29C 59/00; B29C 59/02; B29C 59/022; B29C 59/026; B29C 2059/023; G03F 7/0002; G03F 7/70483; G03F 7/70491; G03F 7/70766; G03F 7/70775; H01L 21/0271
USPC .................. 700/120; 118/100; 264/40.1, 308
See application file for complete search history.

(56) References Cited

U.S. PATENT DOCUMENTS

2007/0114696 A1* 5/2007 Miyakoshi .............. B29C 59/02
  264/284
2016/0158978 A1* 6/2016 Aihara .................... B29C 59/02
  264/40.5

FOREIGN PATENT DOCUMENTS

JP            5454160 B2    3/2014

* cited by examiner

*Primary Examiner* — Joseph S Del Sole
*Assistant Examiner* — Lawrence D. Hohenbrink, Jr.
(74) *Attorney, Agent, or Firm* — Rossi, Kimms & McDowell LLP

(57) ABSTRACT

In order to provide an imprint device capable of reducing pattern defects, the imprint device which brings a mold into contact with an imprint material on a substrate and transfers a shape of a surface of the mold onto the substrate includes: a mold holding part which holds the mold; a substrate holding part which holds the substrate; and a measuring unit which measures a contact force generated when a part of the mold or the mold holding part is brought into contact with a predetermined contact part, wherein the contact part is installed at a position in a predetermined plane different from a position in the predetermined plane of the substrate held by the substrate holding part and is installed at a height position corresponding to a height of a surface of the substrate held by the substrate holding part.

15 Claims, 8 Drawing Sheets

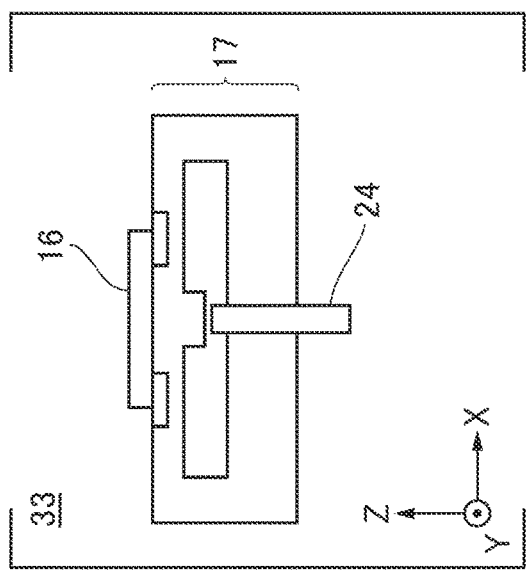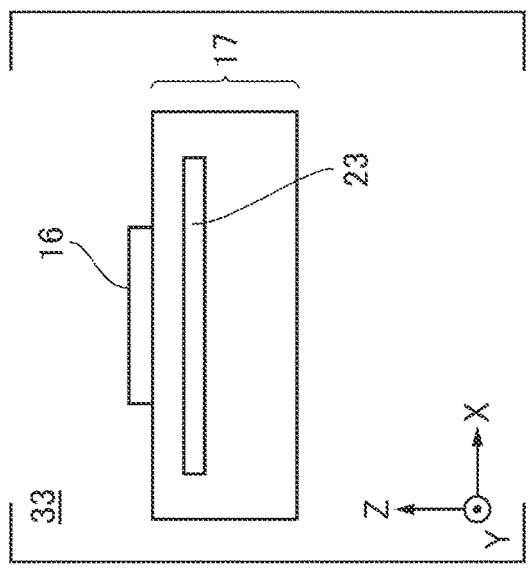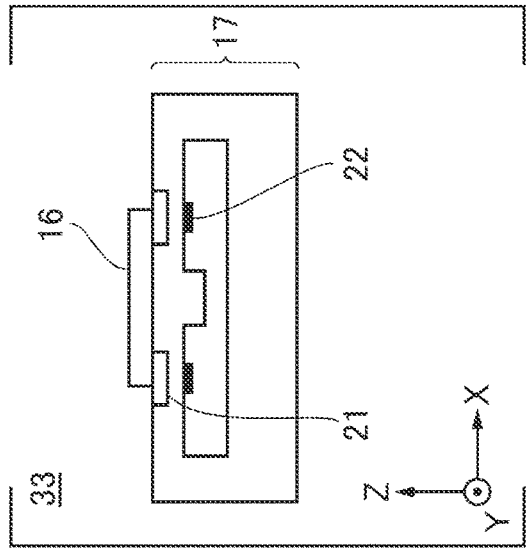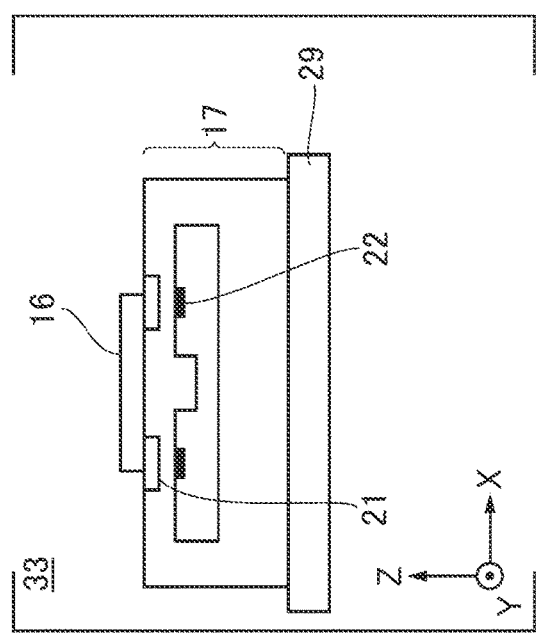

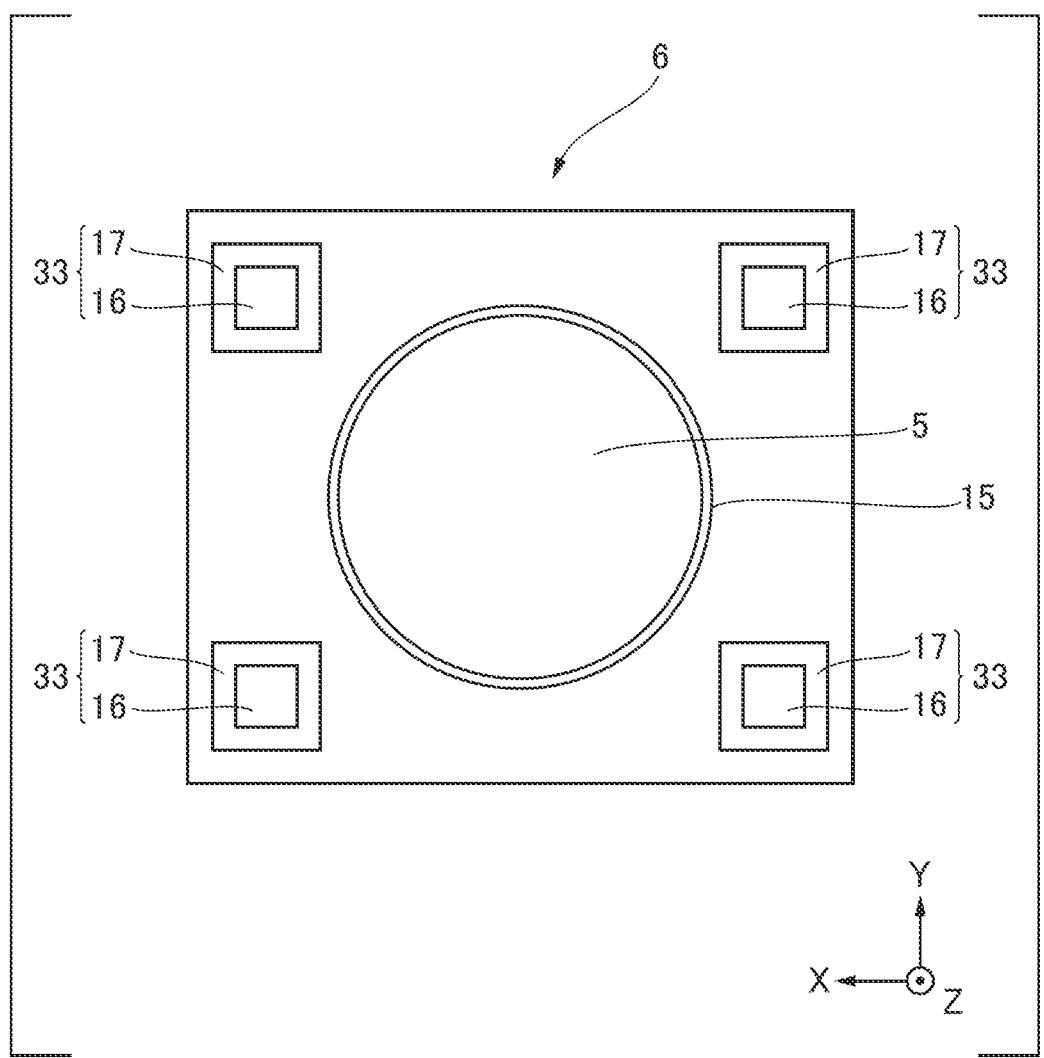

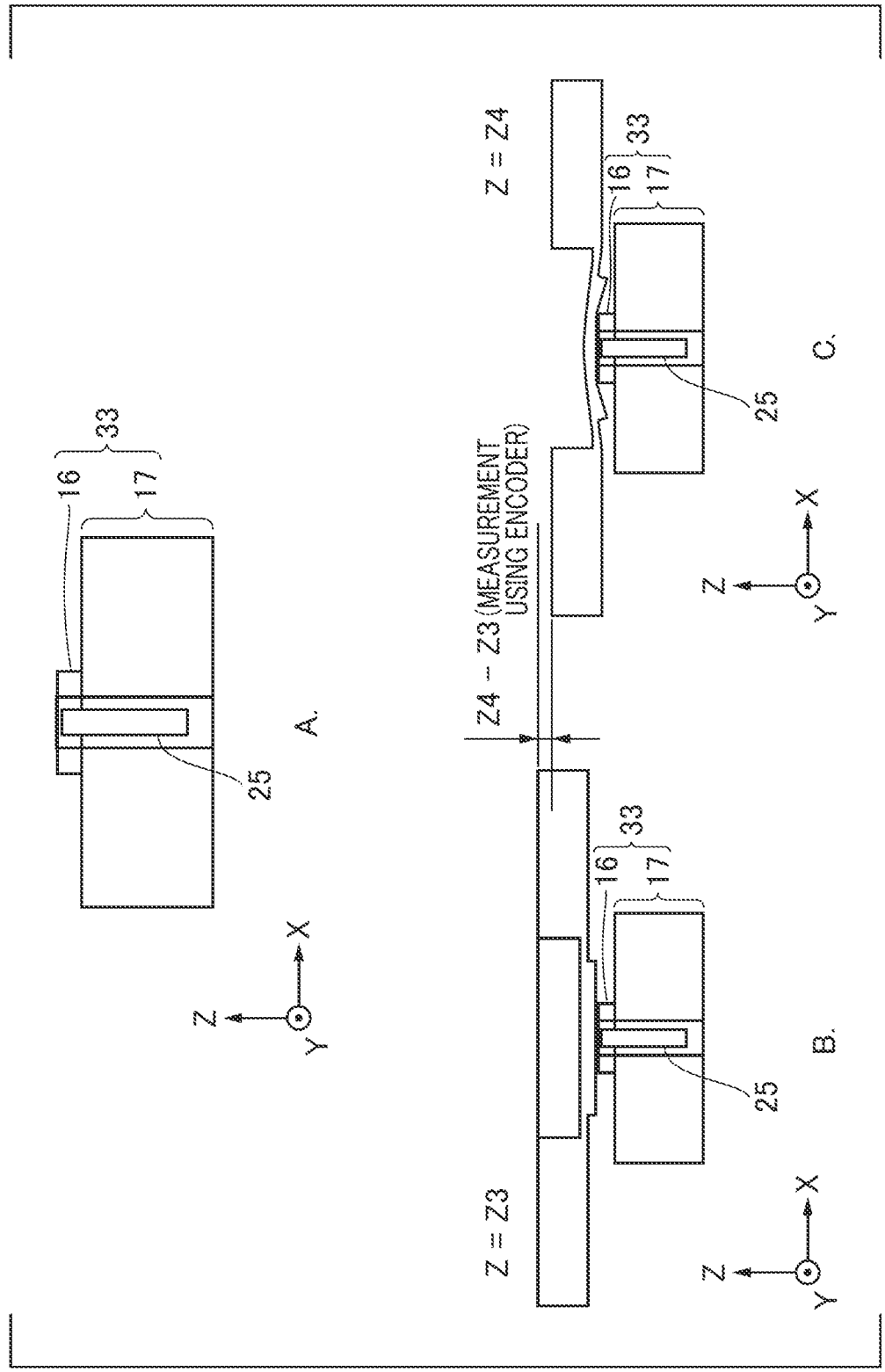

IMPRINT DEVICE AND METHOD FOR MANUFACTURING ARTICLE

BACKGROUND OF THE INVENTION

Field of the Invention

The present invention relates to an imprint device and a method for manufacturing an article.

Description of the Related Art

There is a demand for reducing a size of a semiconductor device, an MEMS, or the like, and therefore a microfabrication technique for imprinting an uncured imprint material on a substrate using a mold having a pattern portion and forming a pattern of the imprint material on the substrate has attracted more attention than conventional photolithography techniques. This technique is so-called an imprint technique and it is possible to form a fine structure on the order of several nanometers on a substrate. Examples of the imprint technique include a light curing method, in which an uncured imprint material is first supplied on a substrate, then the imprint material on the substrate is brought into contact with a pattern portion of a mold, and so that a pattern of an imprint material corresponding to a fine concave and convex pattern formed in the pattern portion is imprinted on the substrate.

Along with the reduction of a size of a pattern, there is an increasing demand for overlay accuracy of a mold and a predetermined pattern formed on a substrate. In order to achieve high accuracy of superimposition, not only the alignment between a mold and a substrate in a planar direction but also the vertical alignment at the time of contact and the flatness of the mold and the substrate are important. In order to make this vertical alignment have high precision, in the imprint device described in Japanese Patent No. 5454160, a plurality of pressure sensors is provided at positions facing a mold on a stage which holds a substrate. The pressure detected by this pressure sensor is monitored and a mold pressurizing mechanism is controlled so that the pressure applied to the mold falls within an appropriate range.

However, when the pressure sensor is provided at a position facing the mold on the substrate stage, that is, at a position in which the substrate is held, the flatness of the substrate deteriorates and pattern defects can occur.

SUMMARY OF THE INVENTION

One aspect of the present invention is to provide an imprint device capable of reducing pattern defects caused by, for example, deterioration of flatness of a substrate.

In order to accomplish the above objective, one aspect of the present invention is an imprint device which brings a surface of a mold into contact with an imprint material on a substrate and imprint a shape of the surface of the mold onto the substrate including: a mold holding part which holds the mold; a substrate holding part which holds the substrate; a contact part which can come into contact with the mold or the mold holding part when at least one of the mold holding part and the substrate is moved in a height direction, is installed at a position in a predetermined plane different from a position in the predetermined plane of the substrate held by the substrate holding part, and is installed at a height position corresponding to a height of a surface of the substrate held by the substrate holding part; and a measuring unit which measures a contact force when the mold or the mold holding part comes into contact with the contact part.

Further features of the present invention will become apparent from the following description of exemplary embodiments with reference to the attached drawings.

BRIEF DESCRIPTION OF THE DRAWINGS

FIGS. 2A to 2D are diagrams illustrating a plurality of examples of a measuring unit.

FIG. 3 is a diagram illustrating an example of a substrate state including a plurality of measuring units.

FIG. 5 is a diagram illustrating a measuring unit and the periphery thereof according to a third embodiment.

DESCRIPTION OF THE EMBODIMENTS

First Embodiment

An aspect for carrying out the present invention will be described below with reference to the drawings and the like.

Figure 1:
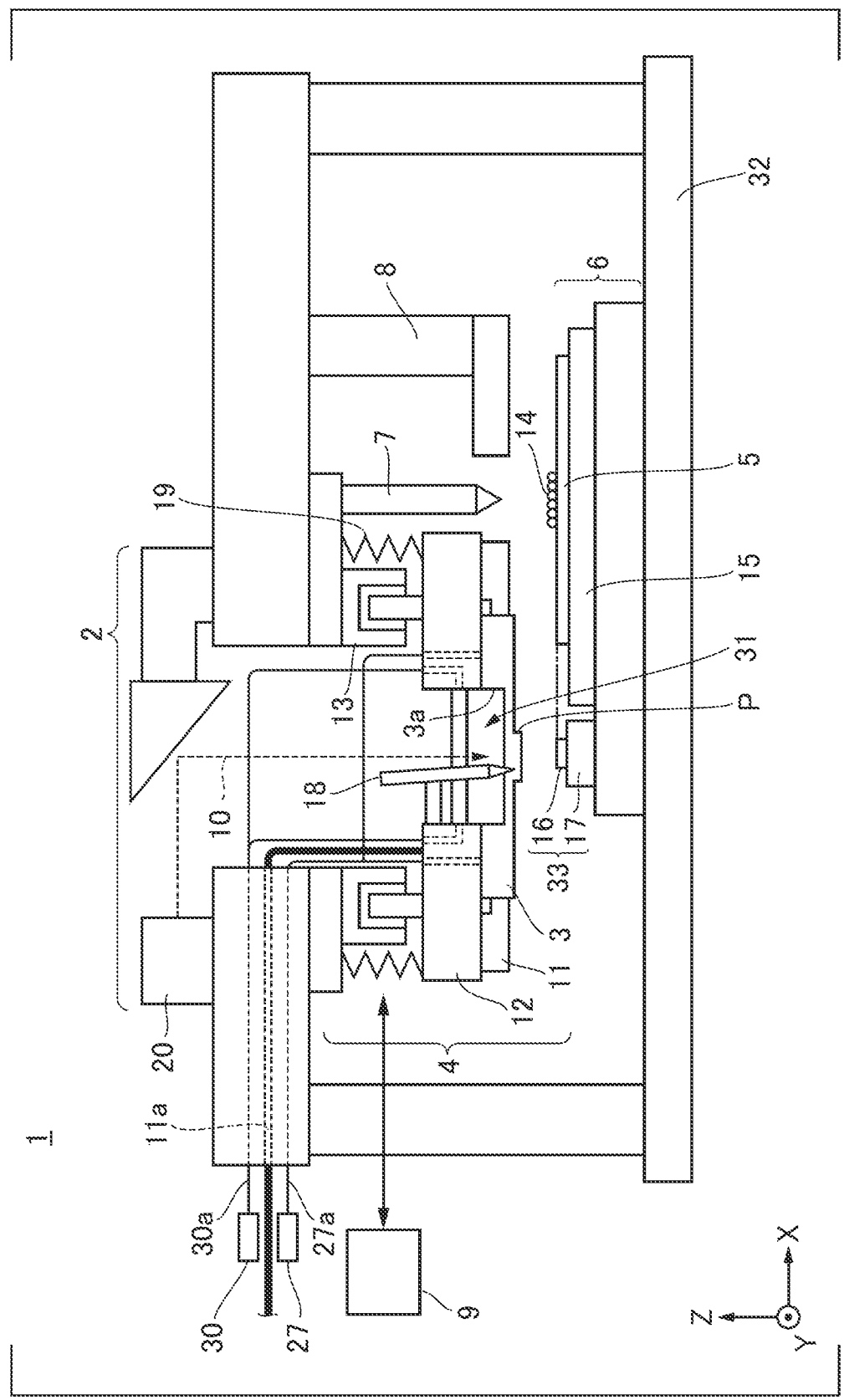
FIG. 1 is a diagram illustrating a configuration of an imprint device according to a first embodiment.

A configuration of an imprint device according to an embodiment of the present invention will be described first. FIG. 1 is a schematic diagram illustrating a configuration of the imprint device according to a first embodiment. An imprint device 1 in this embodiment is a processing device for imprinting a concave and convex pattern of a mold onto a substrate which is to be processed in a semiconductor device manufacturing process, and is a device to which a light curing method is applied among imprint techniques. The imprint device 1 performs an imprint process of imprinting a pattern formed of an imprint material onto the substrate using the mold. The imprint process is a process of bringing the imprint material on the substrate into contact with the mold (imprinting), curing the imprint material in a contact state, and leaving a pattern formed of the imprint material on the substrate by releasing (separating) the mold from the cured imprint material. Furthermore, the imprint process may include a step of supplying an uncured imprint material on the substrate. It should be noted that the imprint device 1 may be a planarization layer forming device which forms a planarization layer on the substrate. In the following drawings, description will be provided assuming that axes orthogonal to each other in a plane parallel to a surface of the substrate are defined as an X axis and a Y axis and an axis perpendicular to the X axis and the Y axis is defined as a Z axis. The imprint device 1 in this embodiment forms a pattern on the cured material corresponding to the concave and convex pattern of the mold by bringing uncured imprint material supplied on the substrate into contact with the pattern portion formed on the mold and applying curing energy to the imprint material.

A curable composition (referred to as an uncured resin in some cases) cured by applying curing energy is used for the imprint material.

Examples of the curing energy include electromagnetic waves, heat, and the like. Examples of the electromagnetic waves include light such as infrared rays, visible rays, and ultraviolet rays selected from a wavelength range between 10 nm and 1 mm.

The curable composition is a composition cured by irradiation of light or by heating. A photocurable composition cured by irradiation of light may contain at least a polymerizable compound and a photopolymerization initiator and may contain a non-polymerizable compound or a solvent if necessary. The non-polymerizable compound is at least one selected from the group consisting of a sensitizer, a hydrogen donor, an internal additive type releasing agent, a surfactant, an antioxidant, a polymer compound, and the like.

The imprint material may be applied onto the substrate in a film form by a spin coater or a slit coater. Furthermore, the imprint material may be applied onto the substrate in a droplet form, or in the form of islands or films formed by connecting a plurality of droplets using a liquid ejecting head. The viscosity (viscosity at 25° C.) of the imprint material is, for example, 1 mPa·s or more and 100 mPa·s or less.

The imprint device 1 in this embodiment includes a lighting system unit 2, an imprint head 4 which holds a mold 3, a substrate stage 6 which holds a substrate 5, a supply unit 7, a mold conveyance unit 8, a controller 9, an alignment measuring unit 18, and a measuring unit 33.

The lighting system unit 2 is a lighting means for irradiating the mold 3 with ultraviolet rays 10 at the time of imprint processing. This lighting system unit 2 can be constituted of a light source 20 and a plurality of optical elements which adjust ultraviolet rays emitted from the light source to appropriate light for imprinting.

The mold 3 is a mold (a mold material or a mold) which has a rectangular outer circumferential portion and a pattern portion P having a predetermined pattern (for example, a concave and convex pattern such as a circuit pattern), which is formed three-dimensionally on the opposite surface to the substrate 5. A surface of the pattern portion P is processed to have a high flatness to maintain the adhesion between the surface thereof and a surface of the substrate 5. In the mold 3, a cavity (a concave portion 3a) for facilitating the deformation of the mold 3 (the pattern portion P) is formed on a surface thereof (a surface on which the ultraviolet rays 10 are incident), which is opposite to a surface facing the substrate 5. The concave portion 3a has a circular planar shape and a thickness (depth) thereof is appropriately set in accordance with a size and a material of the mold 3. The concave portion 3a forms a substantially sealed space 31 when the mold 3 is held by the imprint head 4. The concave portion 3a is connected to a mold deforming part 30 via a pipe 30a.

The pressure of the space 31 in the concave portion 3a can be adjusted using the mold deforming part 30. Furthermore, the pressure of the space 31 in the concave portion 3a is measured by a pressure sensor (not shown) and the controller 9 controls an amount of pressurization using the mold deforming part 30 on the basis of a numerical value of the pressure sensor. For example, when the mold 3 is brought into contact with an imprint material 14 on the substrate, the pressure in the space 31 is made higher than the external pressure using the mold deforming part 30 so that the pattern portion P is deformed (inflated) in a convex shape with respect to the substrate 5. Thus, since a central portion of the pattern portion P is in contact with the imprint material 14 on the substrate, a gas (air) is prevented from being trapped between the pattern portion P and the imprint material 14, and the pattern portion P can be efficiently filled with the imprint material 14. It should be noted that the material of the mold 3 is a material such as quartz through which ultraviolet rays are transmitted.

The imprint head 4 includes a mold correction mechanism 11 which corrects the pattern portion P of the mold 3 to a desired shape by applying a compressive force to the mold 3 and a mold holding part 12 which holds the mold. The mold correction mechanism 11 can be electrically connected to a power supply (not shown) through a cable 11a. The mold holding part 12 includes a mold chuck (not shown) which attracts and holds the mold 3 using vacuum suction or an electrostatic force. The mold chuck can be connected to a pressure adjusting part 27 via a pipe 27a. Here, through vacuum evacuation performed by the pressure adjusting part 27, the mold chuck can suction and hold the mold 3. Furthermore, the imprint head 4 can include an actuator 13 (a drive unit) which drives the mold holding part 12. The actuator 13 enables the mold holding part 12 to be driven in the Z axial direction so that the mold 3 is brought into contact with (pressed against) the imprint material supplied on the substrate 5. The actuator 13 is preferably, for example, a linear motor. An elastic member 19 can be installed on a surface of the mold holding part 12 opposite to a surface on which the mold 3 is held.

The substrate 5 includes, for example, a single crystal silicon substrate or a silicon on insulator (SOI) substrate. The imprint material 14 to be imprinted by the pattern portion P of the mold 3 is supplied on the substrate 5.

The substrate stage 6 is a substrate holding part which can hold the substrate 5 on a surface thereof facing the mold holding part 12 and freely move in an XY plane on a base surface plate 32. Although a linear motor can be adopted as an actuator which drives the substrate stage 6, the present invention is not limited thereto. A substrate chuck 15 is disposed on the substrate stage 6. The substrate chuck 15 attracts and holds the substrate 5 using vacuum suction or an electrostatic force.

The supply unit 7 supplies the uncured imprint material 14 on the substrate 5. The imprint material 14 is, for example, a photocurable resin having a property of being cured by receiving ultraviolet rays and is appropriately selected in accordance with a type of semiconductor device to be manufactured. Furthermore, an amount of imprint material 14 to be supplied from the supply unit 7 may be set, for example, in accordance with a thickness (a residual film thickness) of a pattern formed on the substrate 5, a density of a pattern to be formed on the imprint material 14, or the like. The mold conveyance unit 8 transports the mold 3 from the outside of the imprint device 1 to the mold holding part 12.

The alignment measuring unit 18 is provided in the imprint head 4 and measures the deviation of a relative position between the mold 3 and the substrate 5. The alignment measuring unit 18 includes, for example, an alignment scope and a sensor and measures the positional deviation between an alignment mark formed on the mold 3 and an alignment mark formed on the substrate 5 in each of the X axial direction and the Y axial direction. The alignment measuring unit 18 controls a position of the substrate stage so that the relative position between the mold 3 and the substrate 5 is at a desired position. It should be noted that a relative position and a contact force between the mold 3 and the substrate 5 in a vertical direction (a Z direction) are controlled by the controller 9 by changing a current value of the actuator 13 provided in the imprint head 4.

The measuring unit 33 measures a contact force generated when the pattern portion of the mold 3 is brought into contact with the imprint material 14 on the substrate. A contact part 16 in the measuring unit 33 is provided in the substrate stage 6 and installed at a position different from a position at which the substrate 5 is held. That is to say, the contact part 16 is disposed at a position in which the contact part 16 can be in contact with the mold 3 or the mold holding part 12 when at least one of the mold holding part 12 and the substrate stage is moved in a height direction and is caused to approach the contact part 16. Furthermore, the contact part 16 has a significant feature in which the contact part 16 is installed at a different position in a predetermined plane (the XY plane) with respect to a position in the predetermined plane (the XY plane) of the substrate held by the substrate stage 6. It should be noted that the predetermined plane (the XY plane) is a plane perpendicular to the height direction (the Z direction).

That is to say, by disposing the contact part 16 of the measuring unit 33 at a position in the XY plane different from a position in which the substrate 5 is held, it is possible to measure a contact force without reducing the flatness or the rigidity of a substrate holding surface. The measuring unit 33 can include the contact part 16 and a measuring instrument 17. At the time of measuring a contact force, the contact part 16 can be in contact with the pattern portion P of the mold 3 by moving at least one of the mold holding part 12 and the substrate stage in the height direction as described above. Furthermore, the contact part 16 is installed at a height position corresponding to the height of the surface of the substrate 5 held on the substrate stage 6. That is to say, a height position in which the contact part 16 is installed is substantially the same as the height of the surface of the substrate 5 held by the substrate stage 6 and a height difference should be preferably within ±0.1 mm. It should be noted that a height position of the contact part 16 may be set in consideration of a thickness of the imprint material 14 supplied onto the substrate. By setting the height of the contact part 16 to be substantially the same as the height of the surface of the substrate, it is possible to more accurately measure a contact force generated at the position in which the mold 3 is in contact with the substrate 5 or the imprint material in the actual imprint processing. However, the height of the contact part 16 may be different from the height of the surface of the substrate by a predetermined distance, as far as they are corresponding to each other.

The contact part 16 may be, for example, a planar shape or a rod shape. The contact part 16 is not limited to these shapes as long as a contact force can be measured by bringing the contact part 16 into direct contact with the pattern portion P, but a shape which does not damage the mold 3 is desirable. As a material of the contact part 16, a metal, glass, a resin can be used. In order to minimize a damage of the mold or occurrence of particles when the pattern portion P of the mold 3 is pressed and comes into contact with the contact part 16, a resin material is desirable, and a polyacetal type or a fluorine type are particularly desirable. For example, the entire contact part 16 may be a resin or the surface of a metal may be coated with a resin. In this case, at least a surface portion of the contact part 16 with which the mold comes into contact is coated with a resin.

The measuring instrument 17 is provided between the contact part 16 and the substrate stage 6. The measuring instrument 17 measures a contact force when the pattern portion P of the mold 3 is brought into contact with the contact part 16. The measuring instrument 17 is, for example, a force sensor, a displacement sensor, or the like. It should be noted that the contact part 16 and the measuring instrument 17 may be integrally formed or separately disposed as separate members.

A specific example of the measuring unit 33 will be described below with reference to FIGS. 2A to 2D. FIGS. 2A to 2D are diagrams illustrating a plurality of examples of the measuring unit 33. As the measuring instrument 17 of the measuring unit 33, for example, a force sensor may be used. As illustrated in FIG. 2A, as the force sensor, a diaphragm 21 and a strain gauge 22 which are generally used as a force sensor may be adopted, or as illustrated in FIG. 2B, an electrostatic capacity sensor 23 may be incorporated. Furthermore, as illustrated in FIG. 2C, a displacement sensor 24 which measures an amount of elastic deformation when the pattern portion P of the mold 3 is pressed against the contact part 16 may be used so that the measured amount is converted into a contact force. In addition, as illustrated in FIG. 2D, the measuring unit 33 may include an elevator 29 which drives the contact part 16 and the measuring instrument 17 in a pressing direction. By moving the measuring unit 33 upward and downward using the elevator, it is possible to measure a contact force by moving the contact part 16 in a +Z direction and bringing the contact part 16 into contact with the pattern portion P.

It should be noted that, although the imprint device 1 illustrated in FIG. 1 have one measuring unit 33 (a contact part 16), a plurality of measuring units 33 (contact parts 16) may be provided. FIG. 3 is a diagram illustrating an example of a substrate stage 6 having the plurality of measuring units 33 (the contact parts 16). By providing the plurality of measuring units 33 (the contact parts 16), the measurement values can be averaged and the measurement error can be minimized. Furthermore, the imprint device may utilize a function of issuing an error notice when a difference between the measurement results of the plurality of measuring units 33 is large and a function of notifying the need of adjustment or the replacement timing of the measuring units 33. In addition, the contact parts 16 of the plurality of measuring units 33 may be installed at height positions which are different from each other, thereby making it possible to cope with substrates with various thicknesses or thicknesses of imprinting materials supplied onto the substrates.

Referring to FIG. 1, the controller 9 controls each unit of the imprint device 1 to perform the imprint processing. Furthermore, the controller 9 controls a contact force at the time of imprint processing performed on the substrate on the basis of the measurement of the measuring unit 33. To be specific, the controller 9 performs control so that a driving force (here, an electric current value) of the actuator 13 becomes a target value. The controller 9 is constituted of a computer, a sequencer, or the like which includes a storage means such as a magnetic storage medium, and which is connected to each constituent element in the imprint device 1 through a line to perform control for each constituent element using a program or a sequence. The controller 9 may be configured integrally with the imprint device 1 or may be installed at a location separate from the imprint device 1 for the remote control.

A control sequence of a contact force based on the measurement result of the measuring unit 33 will be described below. First, the contact part 16 is moved to a position directly under the pattern portion P by driving the substrate stage 6. Subsequently, by driving the imprint head 4 (the mold 3) in a −Z direction, the pattern portion P can come into contact with the contact part 16. At that time, by driving either the substrate stage 6, the measuring unit 33, or the contact part 16 in the +Z direction using the actuator (the drive unit) included in the substrate stage 6, the pattern portion P may come into contact with the contact part 16. That is to say, by moving at least one of the mold holding part 12 and the substrate stage to approach each other in the height direction as described above, a contact force is measured using the measuring instrument 17 when the pattern portion P of the mold 3 is brought into contact with the contact part 16. A measurement value (a contact force as a measurement result) of the measuring instrument 17 and a driving force of the actuator 13 are stored in a storage means (a memory) in the controller 9. The controller 9 stores a relationship between the measurement value of the measuring instrument 17 and the driving force of the actuator 13 as correction information for controlling a contact force.

When the imprint processing is performed on the substrate 5, an electric current value of the actuator 13 is corrected and controlled on the basis of the correction information stored in the memory so that a desired contact force is obtained. As a specific example, in a case in which a target value of a contact force when the imprint material is cured is 0 to 10 N, each electric current value corresponding to the contact force measured by the measuring instrument 17 is acquired every 1 N from 0 to 10 N, and stored in the memory as correction information. At that time, a range of values requiring highly precise control of the contact force may be set more finely as necessary. To be specific, for example, in a range of 3 to 5 N, each electric current value may be acquired every 0.1 N of the contact force from 3 to 5 N, and the like. The controller 9 sets a target value of the electric current value of the actuator 13 on the basis of this correction information stored in the memory so that a contact force between the mold 3 and the substrate 5 at the time of performing the imprint process is properly controlled to be a desired value. Therefore, the controller 9 controls the actuator 13 so that the electric current value of the actuator 13 is the target value at the time of contact. It should be noted that an encoder (a distance detector) (not shown) separately provided may be used for driving the actuator 13 until the mold 3 comes into contact with the substrate 5. Generally, a relationship between a contact force and an electric current value of the actuator 13 can be changed by the rigidity of the mold 3 and the substrate 5, a resistance force due to a preload spring, and the like. For example, a resistance force changes according to a rigidity change of parts due to aging. In this embodiment, since the relationship between the contact force and the electric current value of the actuator 13 is stored as correction information in the memory and the contact force is controlled on the basis of the correction information, it is possible to correct an resistance force change due to aging and maintain an appropriate contact force. It should be noted that, although the contact force is adjusted by controlling the electric current value of the actuator 13, it is also possible to adjust the contact force by adjusting a voltage value of the actuator 13, or by a driving means for moving the substrate stage side in the height direction. Alternatively, a contact force may be adjusted by adjusting both of the actuator 13 and the driving means.

It should be noted that a timing at which the mold 3 is brought into contact with the contact part 16, that is, a timing at which a contact force is measured can be arbitrarily set. Before the imprint processing, it is desirable to measure the contact force by the measuring unit 33 and, during the imprint processing, to control the actuator 13 using the electric current value corrected on the basis of the measurement result, but the present invention is not limited thereto. For example, this may be performed immediately after the replacement of the mold 3, and may include correction including an error caused by an individual difference such as a mold size and a weight. Alternatively, correction information may be updated at predetermined time intervals as periodic maintenance.

Also, as the mold 3 used for measuring a contact force, a mold actually used for imprint processing may be used or a dummy mold as a tool whose outer size and weight data have been obtained in advance may be used. For example, the dummy mold may be provided in the device and may be appropriately exchanged with a mold for imprinting by the mold conveyance unit 8 at the time of measuring a contact force. Furthermore, a plurality of dummy molds having different shapes and materials may be used.

As described above, in the present invention, it is possible to realize high-precision alignment between the substrate and the mold. Furthermore, since the resistance anomaly change abnormality can be monitored in advance, there is also the effect of preventing an excessive force from being applied to the mold or the substrate, and safety against breakage can be secured.

It should be noted that, although the measuring unit 33 is installed on the substrate stage 6 in this embodiment, the measuring unit 33 may be provided separately from the substrate stage 6. In this case, the measuring unit 33 moves in the XY plane on the base surface plate 32 using, for example, an actuator. When the contact force is measured, the contact part 16 is moved to a position directly under the pattern portion P by driving the measuring unit 33.

Second Embodiment

An imprint device according to a second embodiment of the present invention will be described below. The matters which are not mentioned in the second embodiment are the same as those in the first embodiment. In the second embodiment, the pressurization using a mold deforming part 30 in a concave portion 3a provided in a mold 3 is also controlled on the basis of the measurement result of a measuring unit 33.

Figure 4A:
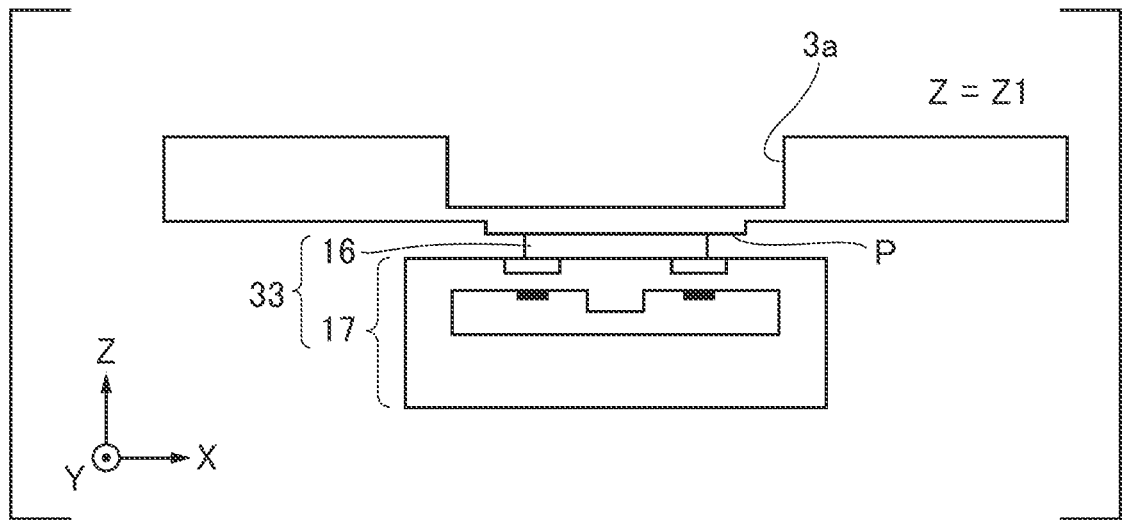
FIGS. 4A and 4B are diagrams illustrating a measuring unit and the periphery thereof according to a second embodiment.
Figure 4B:
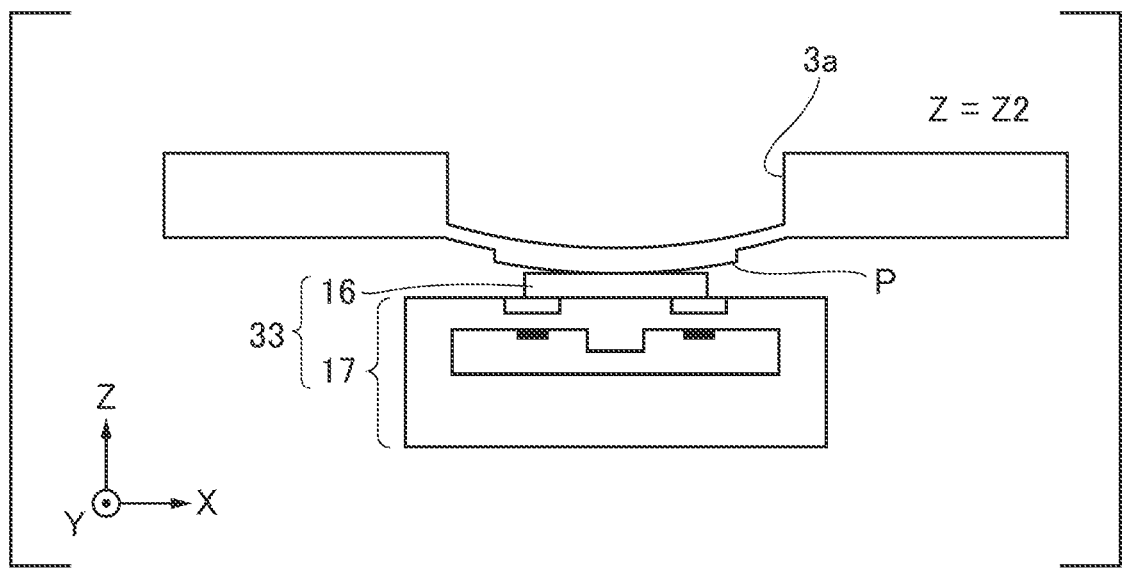

FIGS. 4A and 4B are diagrams illustrating the measuring unit 33 and the periphery thereof according to a second embodiment. It should be noted that the pressure in the concave portion 3a is measured by the pressure sensor (not shown). First, as illustrated in FIG. 4A, a pattern portion P of the mold 3 is brought into contact with a contact part 16 in a state in which no pressure is applied by the mold deforming part 30 and positional information Z1 of an actuator 13 is acquired when a contact force is measured by the measuring instrument 17. Then, after the mold 3 is released from the contact part 16, the pattern portion P of the mold 3 is again brought into contact with the contact part 16 in a state in which the concave portion 3a is pressurized using air from the mold deforming part 30 (FIG. 4B), and positional information Z2 of the actuator 13 at the time of measuring the contact force is acquired. An amount of expansion of the mold 3 at the time of pressurization is acquired from a difference between the positional information Z1 and the positional information Z2 and an actual amount of pressurization is calculated based on the rigidity of the mold 3. A pressure sensor value is corrected from this value and the amount of pressurization is controlled. The pressure at the time of expansion can be corrected with high accuracy by measuring a plurality of points within a range of, for example, −30 to +30 kPa. Furthermore, when a difference between the calculated pressure and the measured value of the pressure sensor is large, an error notice is issued as a pressure sensor failure. By these means, it is possible to correct the pressure sensor and to detect the abnormality thereof and it is possible to check the safety of the device.

Third Embodiment

An imprint device according to a third embodiment of the present invention will be described below. The matters which are not mentioned in the third embodiment are the same as those in the first embodiment. In the third embodiment, a displacement sensor 25 is used as a measuring instrument 17 and a contact force is acquired in addition to the rigidity of a mold 3.

FIG. 5 is a diagram illustrating a measuring unit 33 and the periphery thereof according to the third embodiment. As illustrated in (a) of FIG. 5, in this embodiment, the displacement sensor 25 is used as the measuring instrument 17. The displacement sensor 25 is fixed so that a surface of a contact part 16 facing a mold holding part 12 is used as a reference position and a certain range thereof can be measured in the Z direction. The displacement sensor 25 measures a surface position of a pattern portion P of the mold 3 at the time of contact driving of the mold 3 (at the time of performing driving in the −Z direction). The displacement sensor 25 reads positional information Z3 of an actuator 13 using an encoder (not shown) provided near the actuator 13 ((b) of FIG. 5) when a surface of the pattern portion P reaches a reference position. Thus, the mold 3 is further driven in the −Z direction and moved to an arbitrary position Z4 ((c) of FIG. 5). Since an amount of deformation of the mold 3 when the mold 3 is moved to a position Z4 is Z4−Z3, it is possible to acquire a contact force taking into consideration of the rigidity of the mold 3. The obtained contact force is compared with the generated force of the actuator 13 at the arbitrary position Z4, that is, a theoretical contact force by the actuator 13, so that an actual contact force is controlled. According to this method, since the displacement sensor is used, not only the control of the contact force but also the measurement of a height of each part on an imprint head 4 side, for example, by driving the displacement sensor 25 using a substrate stage 6, are possible. That is to say, the measuring unit 33 can also be used for, for example, the tilt attitude measurement of the mold 3, the correction of cyclic errors of the encoder for imprinting, checking of interference of the mold 3 toward the substrate stage, and the like.

Fourth Embodiment

An imprint device according to a fourth embodiment of the present invention will be described below. The matters which are not mentioned in the fourth embodiment are the same as those in the first embodiment. In the fourth embodiment, a mold holding part 12 includes a protruding part 26 that is brought into contact with a contact part 16.

Figure 6:
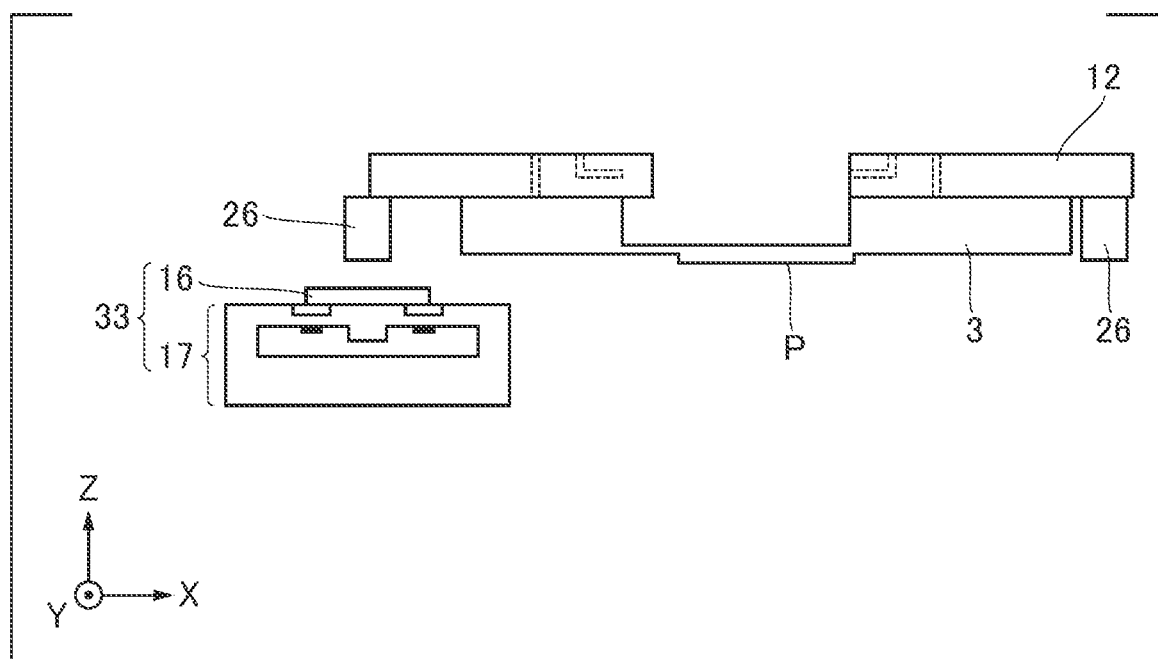
FIG. 6 is a diagram illustrating a measuring unit and the periphery thereof according to a fourth embodiment.

FIG. 6 is a diagram illustrating a measuring unit 33 and the periphery thereof according to the fourth embodiment. The protruding part 26 is installed in the mold holding part 12. A height position of a contact surface of the protruding part 26 with the contact part 16 is substantially the same as a pattern portion P of a mold 3. It should be noted that the height position of the contact surface of the protruding part 26 may be configured to be changeable. The protruding part 26 comes into contact with the contact part 16 at the time of measuring a contact force. At the time of measuring the contact force in accordance with this embodiment, first, the contact part 16 is moved to a position directly under the protruding part 26 by driving a substrate stage 6. Subsequently, by moving the imprint head 4 (the mold 3) in the −Z direction, the protruding part 26 can come into contact with the contact part 16. It should be noted that, at that time, by driving any one of the substrate stage 6, the measuring unit 33, and the contact part 16 in the +Z direction using an actuator (a drive unit) included in the substrate stage 6, the protruding part 26 may come into contact with the contact part 16.

According to this embodiment, since the contact part 16 is not brought into contact with the mold 3, no replacement time is required and the use of the dummy mold is not required. Furthermore, by providing the protruding part 26 in the vicinity of each actuator 13, it is possible to make a correction in consideration of the balance of a plurality of actuators.

Fifth Embodiment

An imprint device according to a fifth embodiment of the present invention will be described below. The matters which are not mentioned in the fifth embodiment are the same as those in the first embodiment. In the fifth embodiment, a contact force is acquired by measuring an amount of floating of a substrate stage 6 using a measuring instrument 17.

Figure 7:
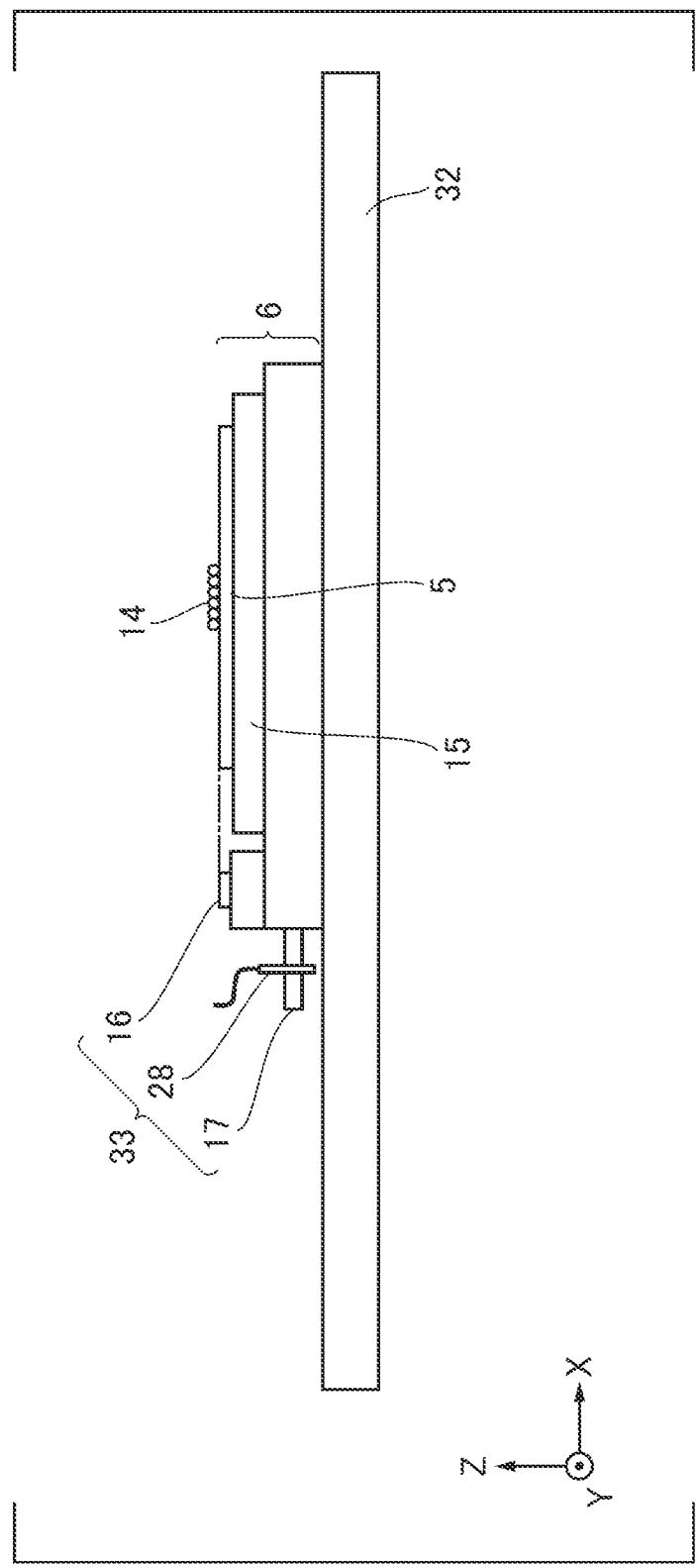
FIG. 7 is a diagram illustrating a measuring unit and the periphery thereof according to a fifth embodiment.

FIG. 7 is a diagram illustrating a measuring unit 33 and the periphery thereof according to the fifth embodiment. The measuring instrument according to this embodiment is installed on the substrate stage 6. The substrate stage 6 floats above a base surface plate 32 due to air or magnetism. The measuring instrument 17 corresponds to a displacement sensor 28 which measures an amount of floating and the measuring unit 33 can monitor the fluctuation of the amount of floating. By measuring a change in amount of floating when the contact part 16 is brought into contact with a pattern portion P of a mold 3, it is possible to acquire a contact force and perform the same correction as in the first embodiment. In a case in which an imprint device has the displacement sensor for detecting float ON/OFF or floating amount, it is unnecessary to additionally provide the displacement sensor as a separate measuring instrument 17, which is advantageous in terms of cost and space.

(Embodiment Associated with Method for Manufacturing Article)

A method for manufacturing an article according to an embodiment of the present invention is appropriate for manufacturing, for example, an article such as a microdevice such as a semiconductor device and an element having a fine structure. The method for manufacturing an article in this embodiment includes a step of forming a pattern on an imprint material coated on a substrate using the above imprint device (a step of performing an imprint process on the substrate) and a step of processing the substrate having a pattern formed thereon due to such processing. Furthermore, such a manufacturing method includes other well-known steps (oxidation, film formation, vapor deposition, doping, planarization, etching, resist peeling, dicing, bonding, packaging, and the like). The method for manufacturing an article in this embodiment is advantageous in at least one of performance, quality, productivity, and production cost of the article, as compared with the conventional method.

A pattern of a cured material molded using the imprint device 1 is used permanently in at least a part of various articles or temporarily when various articles are manufactured. An article is an electric circuit element, an optical element, an MEMS, a recording element, a sensor, a mold, or the like. Examples of the electric circuit elements include volatile or nonvolatile semiconductor memories such as a DRAM, an SRAM, a flash memory, and an MRAM, and semiconductor elements such as an LSI, a CCD, an image sensor, and an FPGA. Examples of a mold include a mold for imprinting and the like.

The pattern of the cured material is used as it is as a constituent member of at least a part of the above-described article or is temporarily used as a resist mask. After etching, ion implantation, or the like is performed in the processing step of the substrate, the resist mask is removed.

Figure 8A:
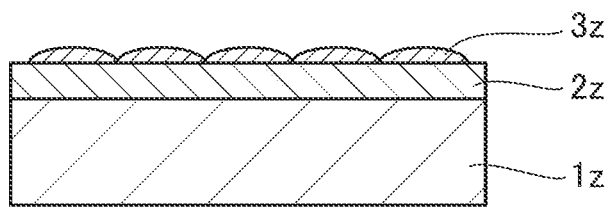
FIGS. 8A to 8F are diagrams illustrating a method for manufacturing an article.

A specific method of manufacturing an article will be described below. As illustrated in FIG. 8A, a substrate $1z$ such as a silicon wafer with a surface having a workpiece $2z$ such as an insulator formed thereon is prepared and then an imprint material $3z$ is applied to a surface of the workpiece $2z$ using an inkjet method or the like. Here, a state in which a plurality of droplet-shaped imprint materials $3z$ are applied on the substrate is illustrated.

Figure 8B:
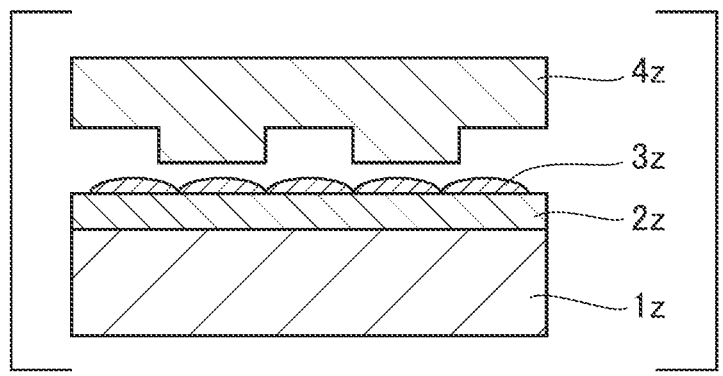
Figure 8C:
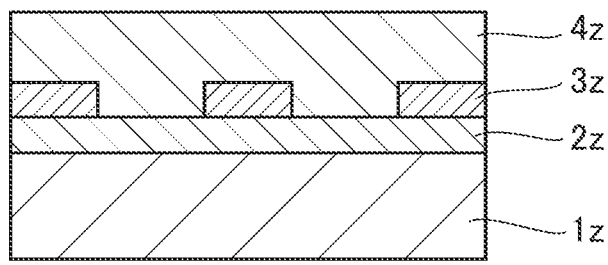

As illustrated in FIG. 8B, an imprint mold $4z$ faces so that a side thereof having a concave and convex pattern formed therein faces the imprint material $3z$ on the substrate. As illustrated in FIG. 8C, the substrate $1z$ having the imprint material $3z$ applied thereto is brought into contact with the imprint mold $4z$ and is subjected to applied pressure. A gap between the mold $4z$ and the workpiece $2z$ is filled with the imprint material $3z$. In this state, when light is radiated as curing energy to be transmitted through the mold $4z$, the imprint material $3z$ is cured.

Figure 8D:
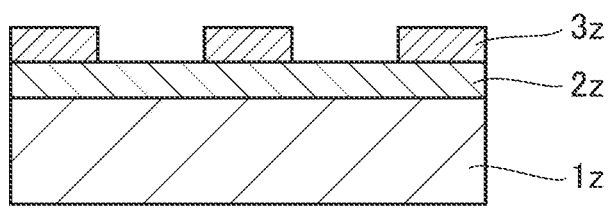

As illustrated in FIG. 8D, after the imprint material $3z$ is cured, when the mold $4z$ and the substrate $1z$ are pulled apart, a pattern of the cured material of the imprint material $3z$ is formed on the substrate $1z$. The pattern of this cured material is obtained by forming a shape in which a concave portion of the mold corresponds to a convex portion of the cured material and a concave portion of the mold corresponds to a convex portion of the cured material, that is, transferring a concave and convex pattern of the mold $4z$ to the imprint material $3z$.

Figure 8E:
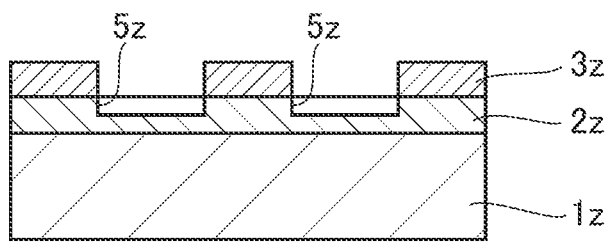
Figure 8F:
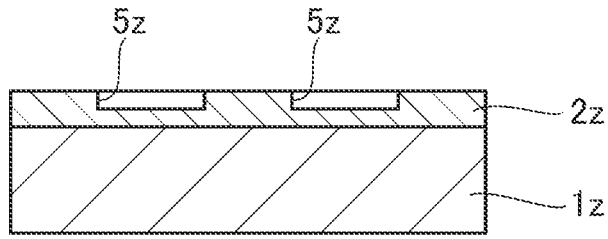

As illustrated in FIG. 8E, when etching is performed using the pattern of the cured material as an etching resistance mask, a portion of the surface of the workpiece $2z$ which is not cured or remains thin is removed, thereby forming grooves $5z$. As illustrated in FIG. 8F, when the pattern of the cured material is removed, an article having the grooves $5z$ formed in the surface of the workpiece $2z$ can be obtained. Here, the pattern of the cured material is removed but may be used as a film for interlayer insulation included in, for example, a semiconductor element, that is, as a constituent member of the article without removing the pattern even after processing.

Other Embodiments

The present invention can also realize a process in which a program which implements one or more of the functions of the above-described embodiments is provided to a system or a device via a network or a storage medium and one or more processors in a computer of the system or the device reads and executes the program. Furthermore, this can also be realized by a circuit (for example, an ASIC) which implements one or more functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-96535 filed on May 18, 2018, which is hereby incorporated by reference herein in its entirety.

What is claimed is:

1. A method for manufacturing an article using an imprint device, wherein the imprint device includes:
   a mold holding part which holds a mold;
   a substrate holding part which holds a substrate;
   a contact part which can come into contact with the mold or the mold holding part when at least one of the mold holding part and the substrate is moved in a height direction, is installed at a position in a predetermined plane different from a position in the predetermined plane of the substrate held by the substrate holding part, and is installed at a height position corresponding to a height of a surface of the substrate held by the substrate holding part; and
   a measuring unit which measures a contact force when the mold or the mold holding part comes into contact with the contact part, and
   wherein the method for manufacturing an article comprises:
   bringing a surface of the mold into contact with an imprint material on the substrate using the imprint device and transferring a shape of the surface of the mold onto the substrate; and
   processing the substrate having a pattern formed thereon in the above step.

2. An imprint device which brings a surface of a mold into contact with an imprint material on a substrate and transfers a shape of the surface of the mold onto the substrate, comprising:
   a mold holding part including a first chuck which holds the mold;
   a substrate holding part including a second chuck which holds the substrate;
   a contact member which can come into contact with the mold or the mold holding part when at least one of the mold holding part and the substrate is moved in a height direction, is installed at a position in a predetermined plane different from a position in the predetermined plane of the substrate held by the substrate holding part, and is installed at a height position corresponding to a height of a surface of the substrate held by the substrate holding part; and
   a measuring instrument which measures a contact force when the mold or the mold holding part comes into contact with the contact member.

3. An imprint device which brings a surface of a mold into contact with an imprint material on a substrate and transfers a shape of the surface of the mold onto the substrate, comprising:
   a mold holding part which holds the mold;
   a substrate holding part which holds the substrate;
   a contact part which can come into contact with the mold or the mold holding part when at least one of the mold holding part and the substrate is moved in a height direction, is installed at a position in a predetermined plane different from a position in the predetermined plane of the substrate held by the substrate holding part, and is installed at a height position corresponding to a height of a surface of the substrate held by the substrate holding part; and a measuring unit which measures a contact force when the mold or the mold holding part comes into contact with the contact part.

4. The imprint device according to claim 3, wherein the contact part is installed at a height position of ±0.1 mm in height of the surface of the substrate held by the substrate holding part.

5. The imprint device according to claim 3, comprising: a plurality of measuring units,
wherein the plurality of measuring units has contact parts installed at height positions which are different from each other.

6. The imprint device according to claim 3, comprising: a controller which controls the contact force on the basis of a measurement result of the measuring unit.

7. The imprint device according to claim 6, wherein the mold holding part or the substrate holding part includes a drive unit, and the controller controls a driving force of the drive unit to control the contact force.

8. The imprint device according to claim 7, wherein the controller includes a memory which stores a relationship between the contact force and the driving force as correction information for the control, and the controller controls a contact force on the basis of the correction information stored in the memory.

9. The imprint device according to claim 7, comprising: a mold deforming part which deforms a shape of the surface of the mold through pressurization,
wherein the controller controls an amount of pressurization of the mold deforming part on the basis of positional information of the mold holding part when the contact part comes into contact with the surface of the mold.

10. The imprint device according to claim 3, wherein the measuring unit includes a pressure sensor.

11. The imprint device according to claim 3, wherein the measuring unit includes a displacement sensor.

12. The imprint device according to claim 3, wherein the mold holding part includes a protruding part which comes into contact with the contact part, and the protruding part is installed at a height position corresponding to a height position of the surface of the mold.

13. The imprint device according to claim 3, wherein the contact part is installed in the substrate holding part, and the measuring unit acquires the contact force from a change in height position of the substrate holding part when the mold comes into contact with the contact part.

14. The imprint device according to claim 3, wherein at least a part of the surface of the contact part is formed of a resin material.

15. The imprint device according to claim 3, wherein the predetermined plane is a plane perpendicular to the height direction.

* * * * *